United States Patent [19]

Kimura

[11] Patent Number: 5,767,901
[45] Date of Patent: Jun. 16, 1998

[54] COLOR LINEAR IMAGE SENSOR

[75] Inventor: Tetsuji Kimura, Tokyo, Japan

[73] Assignee: NEC Corporation, Tokyo, Japan

[21] Appl. No.: 664,180

[22] Filed: Jun. 14, 1996

[30] Foreign Application Priority Data

Jun. 16, 1995 [JP] Japan .................... 7-174022

[51] Int. Cl.$^6$ ............................................. H04N 5/335
[52] U.S. Cl. .................... 348/272; 348/294; 348/304; 348/312; 348/319; 348/324
[58] Field of Search ............................... 348/226, 272, 348/294, 303, 304, 312, 316, 319, 322, 324; H04N 5/335

[56] References Cited

U.S. PATENT DOCUMENTS

| 5,308,970 | 5/1994 | Pool | 348/312 |
| 5,379,067 | 1/1995 | Miura | 348/304 |
| 5,539,536 | 7/1996 | Maki et al. | 348/316 |

FOREIGN PATENT DOCUMENTS 303527 10/1994 Japan ............... H04N 5/335

OTHER PUBLICATIONS

NEC Data Sheet μPD3726, published Feb. 1994, pp. 147–179.

K. Miwada et al., "5Kbit Black-and-White, Color CCD Linear Image Sensor Series", NEC Technical Report, vol. 45, No. 8, 1992, pp. 145–151.

*Primary Examiner*—Glenton B. Burgess
*Attorney, Agent, or Firm*—Sughrue, Mion, Zinn, Macpeak & Seas, PLLC

[57] ABSTRACT

A a color linear image sensor which has: a semiconductor substrate on which the color linear image sensor is formed; three lines of photocells provided on the semiconductor substrate; signal charge transfer units disposed adjacent to the respective photocells; and signal charge reading units through which a signal charge in each of the photocells is read out into the signal charge transfer units adjacent to the each of the photocells; wherein the signal charge transfer units which are formed as single-line CCD registers, respectively corresponding to both side photocells of the three lines of photocells are located not to exist between the photocells, and the signal charge transfer units which are formed as CCD registers corresponding to a central photocell of the three lines of photocells are located on both sides of the central photocell.

19 Claims, 9 Drawing Sheets

COLOR LINEAR IMAGE SENSOR

FIELD OF THE INVENTION

This invention relates to a color linear image sensor, and more particularly to, a color linear image sensor in which three lines of photocells on which R, G and B filters are mounted is in parallel provided.

BACKGROUND OF THE INVENTION

Recently, the demand for a color linear image sensor to read a color image has been increased according as a personal computer is popularized and the performance of a copy machine is enhanced.

In general, a conventional color linear image sensor comprises three CCD(charge-coupled device) linear image sensors which have charge-transfer function and are disposed in parallel, and color filters which are mounted on the CCD linear image sensors and have different colors, i.e., a R(red) filter, a G(green) filter and a B(blue) filter.

In the above color linear image sensor, three CCD linear image sensors with color filters mounted are parallel scanned. Thus, to obtain all the color information(for example, RGB color information) on a position of a sensed object, color information obtained by the first and second scanning lines needs to be temporarily stored in an external memory from the first line scanning(for example, red) until the end of the third line scanning(for example, blue). Namely, the processing of sensed signals cannot be started until all the color information is obtained. Therefore, a large-size external memory is required and the fabrication cost must thereby be increased.

For example, in a case of color linear image sensor for a color PPC with 5000 pixels×3 lines, the capacity C required for an external memory when 8 bit gradation is used is calculated by the next equation (1).

$$C(bit)=5000 \times 8 \times 3 \times (m+1) \qquad (1)$$

Here, m represents a frequency of scanning which corresponds to a line-to-line distance between two adjacent photocell lines. For example, when the size of a pixel in R, G and B photocells is 14 µm×14 µm and the line-to-line distance in both R-G and G-B is 168 µm, m is calculated by the next equation (2) and the capacity C of the external memory is 1560000 bits.

$$m=168 \ \mu m/14 \ \mu m=12 \qquad (2)$$

As seen from the equation (1), to reduce the capacity of an external memory, the distance between three photocell lines needs to be shortened to decrease the frequency of scanning from the first line(for example, red) to the third line(for example, blue).

Main factors to determine the line-to-line distance, i.e., the distance from the center of a photocell 1a to the center of a photocell 1b, are (1) the size of a pixel in the photocell, (2) the size of two signal charge reading units, (3) the size of two signal charge transfer units and (4) the size of a pulse line.

With respect to (1), the size of a pixel in the photocell cannot be changed since it is predetermined.

With respect to (2), it is difficult for the size of two signal charge reading units to be less than 10 µm since a region for connecting the clock wiring for driving the signal charge reading unit with the polycrystalline silicon electrode forming the signal charge transfer unit is required.

With respect to (3), the reduction in the size of the two signal charge transfer units causes degradation of the characteristics because as the size is reduced the maximum amount of signal charge available in the signal charge transfer unit is decreased to narrow the dynamic range of output signal.

With respect to (4), it is also difficult for the size of the pulse line to be reduced. For example, in a color linear image sensor with 5000 pixels×3 lines, the input capacitance of the signal charge transfer unit is about 500 to 1000 pF. Therefore, to achieve high-speed drive with a data rate more than 10 MHz as in the case of a color PPC, the aluminum wiring for clock Φ1, Φ2 needs to be as wide as possible to reduce the load resistance.

As described above, it is difficult for any of the factors (1) to (4) to be changed. As a result, the line-to-line distance in the conventional color linear image sensor structured as mentioned above cannot be reduced.

On the other hand, Japanese patent application laid-open No.2-272769 discloses a color linear image sensor in which parts existing between adjacent photocells(for example, between R-G photocell lines) are arranged to reduce the line-to-line distance, i.e., the width of a part of a pulse line is reduced.

However, since a region for connecting the pulse line with a polycrystalline silicon electrode of a CCD register is further required, the line-to-line distance in total is not substantially reduced.

SUMMARY OF THE INVENTION

Accordingly, it is an object of the invention to provide a color linear image sensor in which the line-to-line distance between three photocells is substantially reduced.

According to the invention, a color linear image sensor, comprises:

a semiconductor substrate on which the color linear image sensor is formed;

three lines of photocells provided on the semiconductor substrate;

signal charge transfer units disposed adjacent to the respective photocells; and signal charge reading units through which a signal charge in each of the photocells is read out into the signal charge transfer units adjacent to the each of the photocells;

wherein the signal charge transfer units which are formed as single-line CCD registers, respectively corresponding to both side photocells of the three lines of photocells are located not to exist between the photocells, and the signal charge transfer units which are formed as CCD registers corresponding to a central photocell of the three lines of photocells are located on both sides of the central photocell.

According to another aspect of the invention, a color linear image sensor, comprises:

a semiconductor substrate on which the color linear image sensor is formed;

three lines of photocells provided on the semiconductor substrate;

signal charge transfer units disposed adjacent to the respective photocells; and signal charge reading units through which a signal charge in each of the photocells is read out into the signal charge transfer units adjacent to the each of the photocells;

wherein a central photocell of the three lines of photocells has two signal charge reading units and two signal charge transfer units, each of which being located one by one on both sides of the central photocell, and each of two photocells on both sides of the central photocell has one signal charge reading unit and one signal charge transfer unit, each of which being located outside each of the two photocells.

In accordance with the color linear image sensor of the invention, the number of the signal charge reading units between adjacent photocells can be decreased from two to one and the number of the signal charge transfer units between adjacent photocells can also be decreased from two to one, thereby reducing the line-to-line distance without affecting the characteristics such as sensitivity and dynamic range.

BRIEF DESCRIPTION OF THE DRAWINGS

The invention will be explained in more detail in conjunction with the appended drawings, wherein.

DESCRIPTION OF THE PREFERRED EMBODIMENTS

Before explaining a color linear image sensor in the preferred embodiments, the aforementioned conventional color linear image sensor will be explained in FIGS. 1 to 5.

Figure 1:
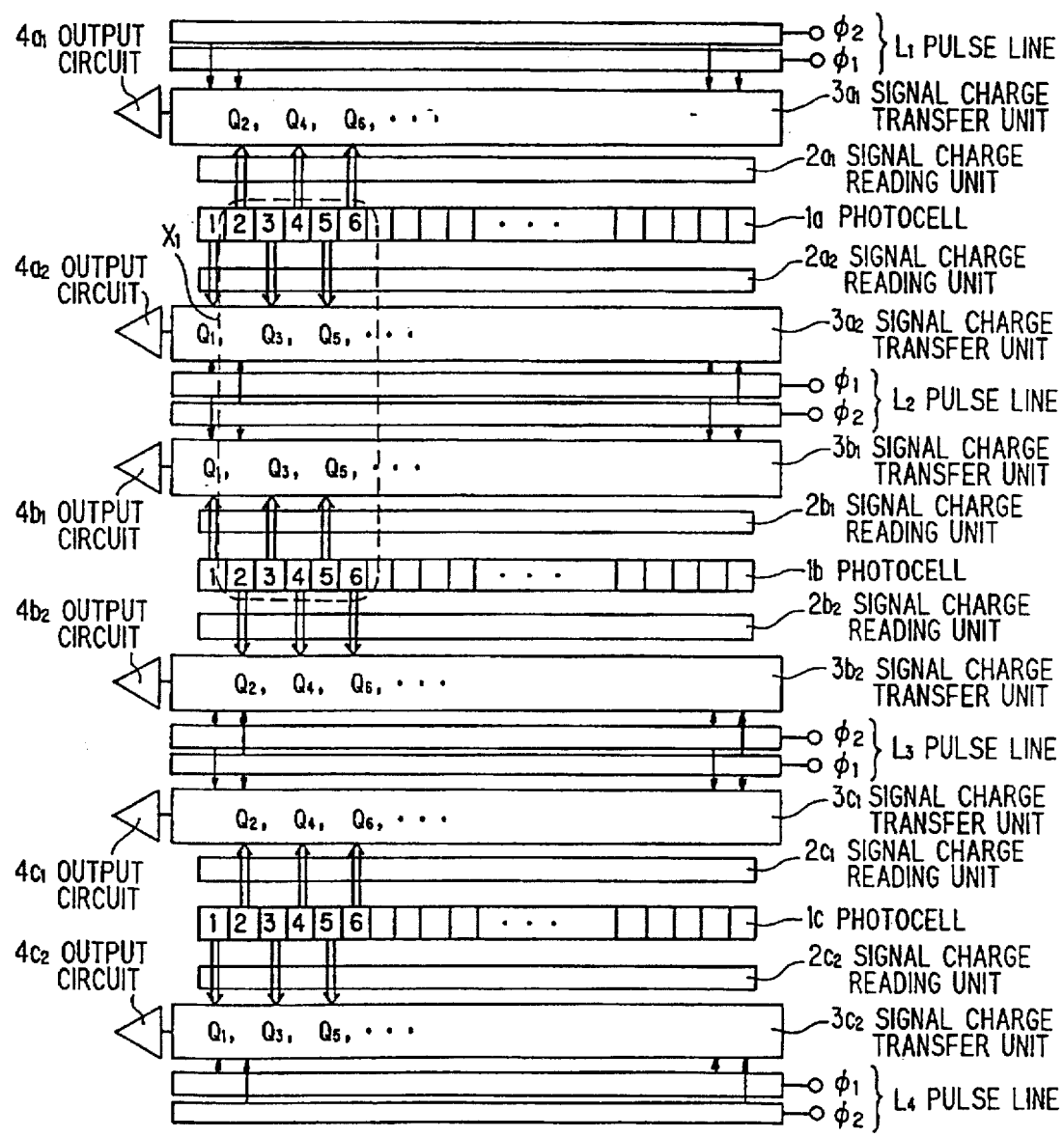
FIG. 1 is a plan view showing a conventional color linear image sensor.

FIG. 1 shows a conventional color linear image sensor. In FIG. 1, 1a, 1b and 1c are photocells on which RGB color filters(not shown) are mounted, and 2a1, 2a2, 2b1, 2b2, 2c1 and 2c2 are signal charge reading units for reading out signal charges in the respective photocells to send them to signal charge transfer units 3a1, 3a2, 3b1, 3b2, 3c1 and 3c2 adjacent to the respective signal charge reading units. Here, signal charges Q1, Q3, Q5 . . . in odd-numbered photocells are read out to a signal charge transfer unit different from that to which signal charges Q2, Q4, Q6 . . . in even-numbered photocells are read out, as shown by thick arrows in FIG. 1.

In the case of CCD linear image sensor, the signal charge transfer units 3a1, 3a2, 3b1, 3b2, 3c1 and 3c2 are in general ion-implantation barrier type two-phase drive CCDs. Pulse lines L1, L2, L3 and L4 for driving the two-phase drive CCDs are located outside the respective signal charge transfer units. The pulse lines L1, L2, L3 and L4 supply two-phase clocks Φ1, Φ2, where connection from the pulse lines to the signal transfer units is shown by thin arrows in FIG. 1.

The signal charge transferred by the respective signal charge transfer units 3a1, 3a2, 3b1, 3b2, 3c1 and 3c2 is externally output to provide a color signal by output circuits 4a1, 4a2, 4b1, 4b2, 4c1 and 4c2 which are formed as floating diffusion regions and comprise signal charge detectors for converting signal charge into signal voltage and analog circuits such as a source follower, an inverter etc.

Figure 2:
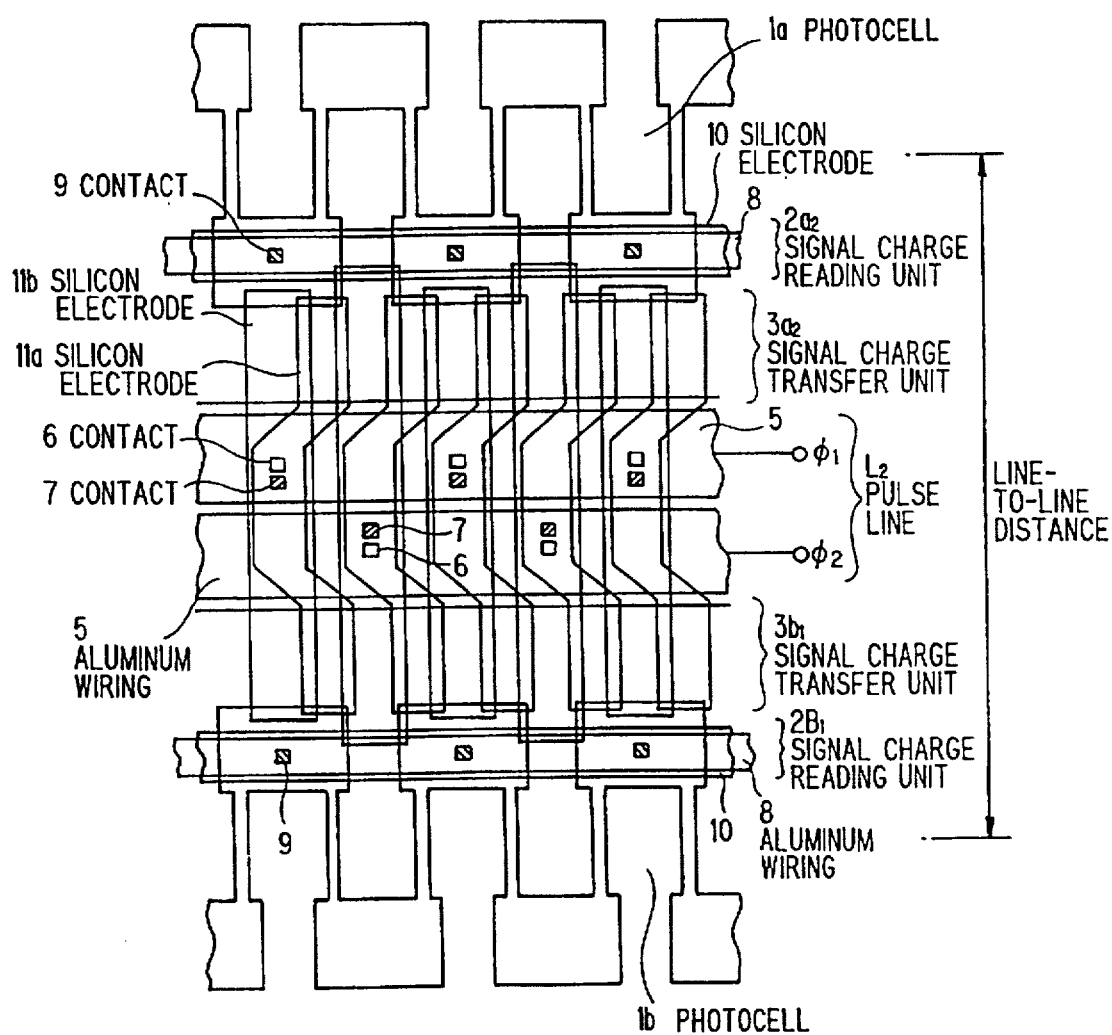
FIG. 2 is an enlarged view showing a region X1 surrounded by dotted line in FIG. 1.

FIG. 2 is an enlarged view of a region X1 surrounded by the dotted line in FIG. 1, wherein like parts are indicated by like reference numerals as used in FIG. 1.

With reference to FIG. 2, 5 is an aluminum wiring to which two-phase clock Φ1, Φ2 is impressed, 6 is a contact for connecting a polycrystalline silicon electrode 11a of a CCD register forming signal charge transfer units 3a2, 3b1 with the aluminum wiring 5, 7 is a contact for connecting two polycrystalline silicon electrodes 11a, 11b of the CCD register, 8 is an aluminum wiring to which clock for driving signal charge reading units 2a2, 2b1 is impressed, and 9 is a contact for connecting a polycrystalline silicon electrode 10 forming a signal charge reading unit with the aluminum wiring 8.

With regard to the main factors to determine line-to-line distance as discussed above, in the example in FIG. 2, the size of a pixel in photocell is 14 µm, the size of two signal charge reading units is 12 µm×2, the size of two signal charge transfer units is 30 µm×2, the size of a pulse line is 45 µm. Further, the size of connection parts between parts (1) to (4) is totally 25 µm. As a result, the line-to-line distance by summing them is 168 µm(m=12).

Figure 3:
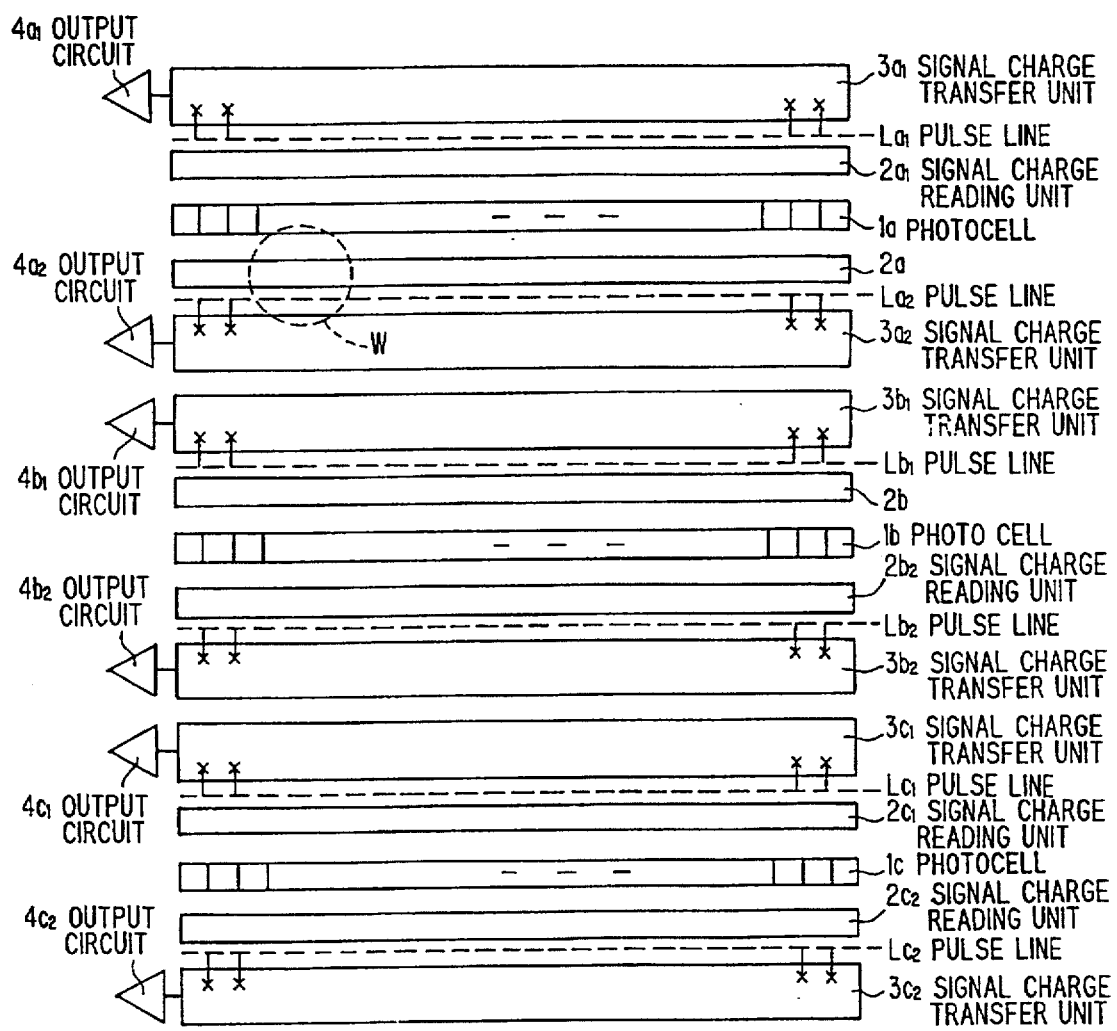
FIG. 3 is a plan view showing another conventional color linear image sensor disclosed in Japanese patent application laid-open No.2-272769.

FIG. 3 shows the color linear image sensor disclosed in Japanese patent application laid-open No.2-272769, wherein like parts are indicated by like reference numerals as used in FIG. 1.

In FIG. 3, La1, La2, Lb1, Lb2, Lc1 and Lc2 are pulse lines for supplying pulses for driving signal charge transfer units 3a1, 3a2, 3b1, 3b2, 3c1 and 3c2, respectively, where connection from the pulse lines to the signal transfer units is shown by thin arrows and marks 'x' in FIG.3.

Figure 4:
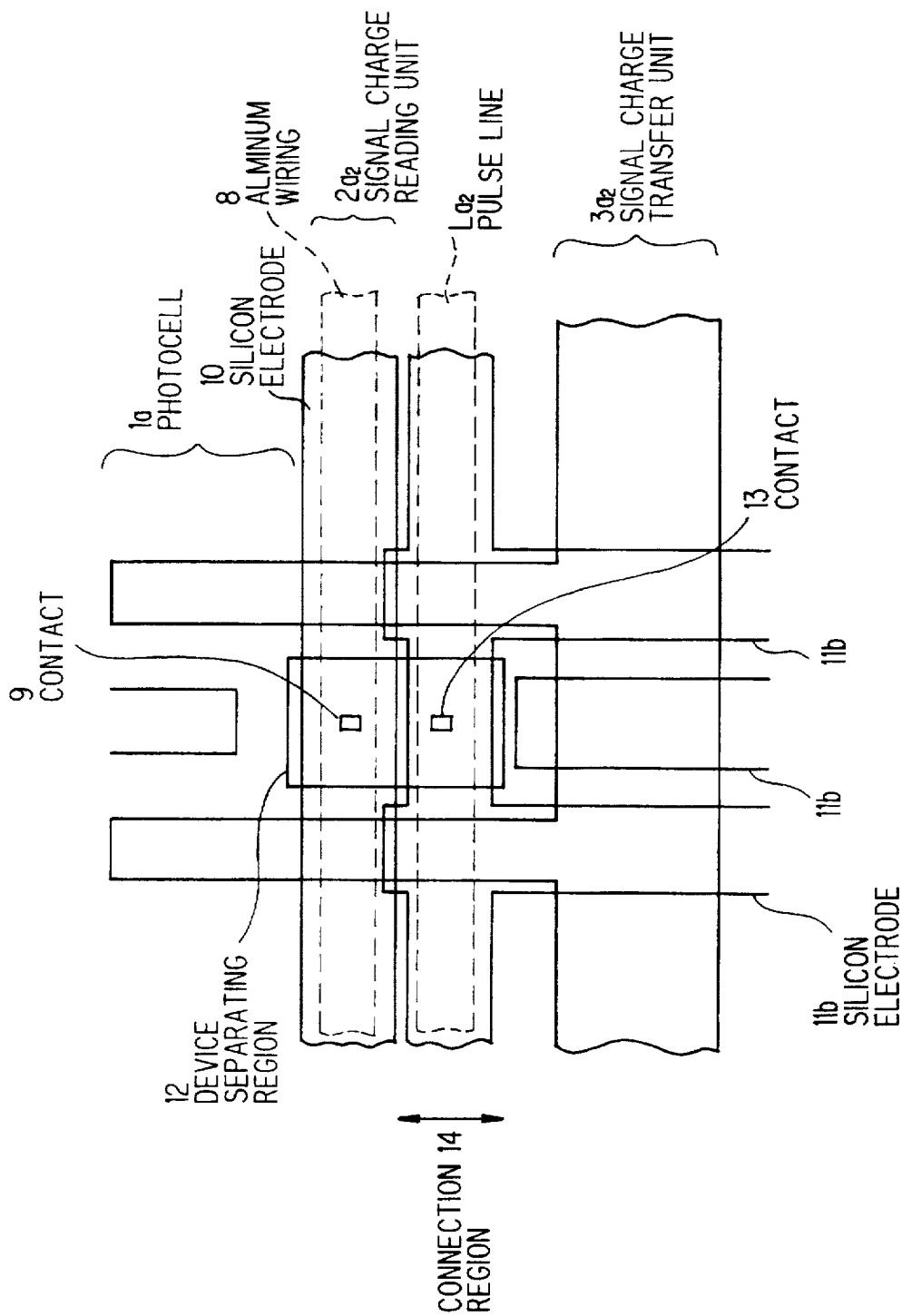
FIG. 4 is an enlarged view showing a region W surrounded by dotted line in FIG. 3.

FIG. 4 is an enlarged view of a region W surrounded by the dotted line in FIG. 3, wherein like parts are indicated by like reference numerals as used in FIG. 3.

In FIG. 4, 12 is a device separating region by LOCOS, and 13 is a contact for connecting a pulse line La2 with a polycrystalline silicon electrode 11b of a CCD register forming a signal charge transfer unit 3a2.

As shown in FIG. 4, the pulse line La2 is located between the signal charge reading unit 2a2 and a signal charge transfer unit 3a2, where the pulse line and the signal charge transfer unit are connected (through the contact 13) with each other between the signal charge reading unit and the signal charge transfer unit.

Compared with the example shown in FIG. 2, the width of a part of the pulse line La2(for example, a portion corresponding to Φ1 clock) can be reduced. However, a region 14 for connecting the pulse line La2 with the polycrystalline silicon electrode 11b of the CCD register is required.

Next, a color linear image sensor in the first preferred embodiment will be explained in FIG. 5, wherein like parts are indicated by like reference numerals as used in FIGS. 1 and 2.

Figure 5:
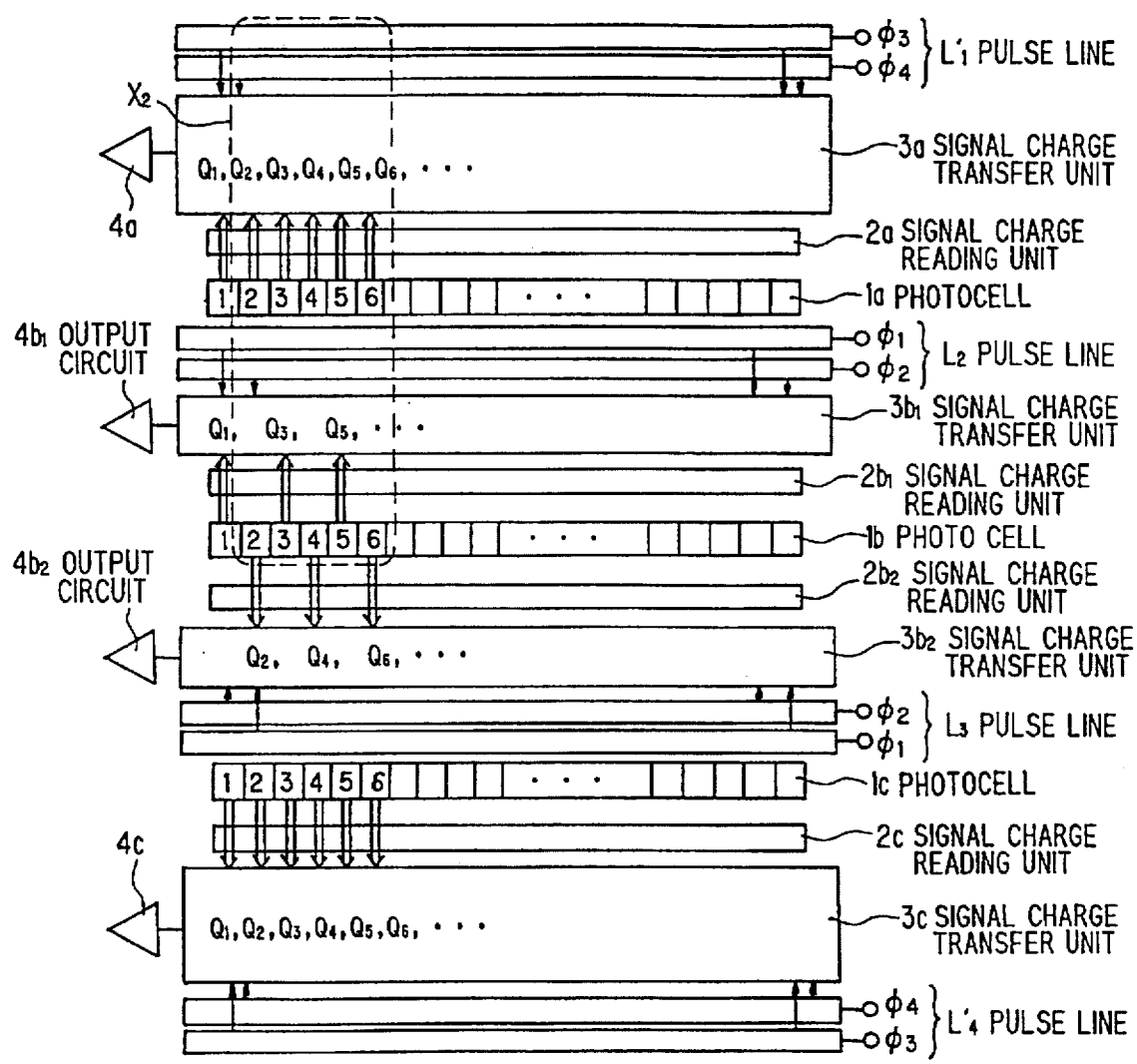
FIG. 5 is a plan view showing a color linear image sensor in a first preferred embodiment according to the invention.

In the first embodiment, as shown in FIG. 5, a photocell 1b located the center of three photocell lines 1a, 1b and 1c, signal charge reading units 2b1, 2b2 and signal charge transfer units 3b1, 3b2 located on both sides thereof, output circuits 4b1, 4b2, and pulse lines L2, L3 have the same size and composition as those of the conventional sensor as shown in FIGS. 1 and 2.

In the first embodiment, signal charge reading units 2a, 2c and signal charge transfer units 3a, 3c which correspond to photocells 1a, 1c on both sides of the photocell 1b are located outside the respective photocells 1a, 1c such that they do not exist between the photocells 1a and 1b and between the photocells 1b and 1c. All the signal charges in the photocells 1a, 1c are read out to the respective signal charge transfer units 3a, 3c composed of single-line CCD registers, respectively and are transferred by two-phase clocks Φ3, Φ4 supplied through pulse lines L1', L4', respectively to be output from output circuits 4a, 4c, respectively.

Here, the odd-numbered signal and even-numbered signal of signal charge in the photocell 1b located on the center are separately transferred by using the two signal charge transfer units 3b1 and 3b2, respectively. On the other hand, the signal charges in the photocells 1a, 1c are by the single-line signal charge transfer units 3a, 3c, respectively. Therefore, the two-phase clocks Φ3, Φ4 supplied through the pulse lines L1', L4' to the signal charge transfer units 3a, 3c are set to have a frequency two times that of the two-phase clocks supplied through the pulse lines L2, L3 to the signal charge transfer units 3b1, 3b so that outputs from the three photocells 1a, 1b and 1c can be completed within the same time.

Figure 6:
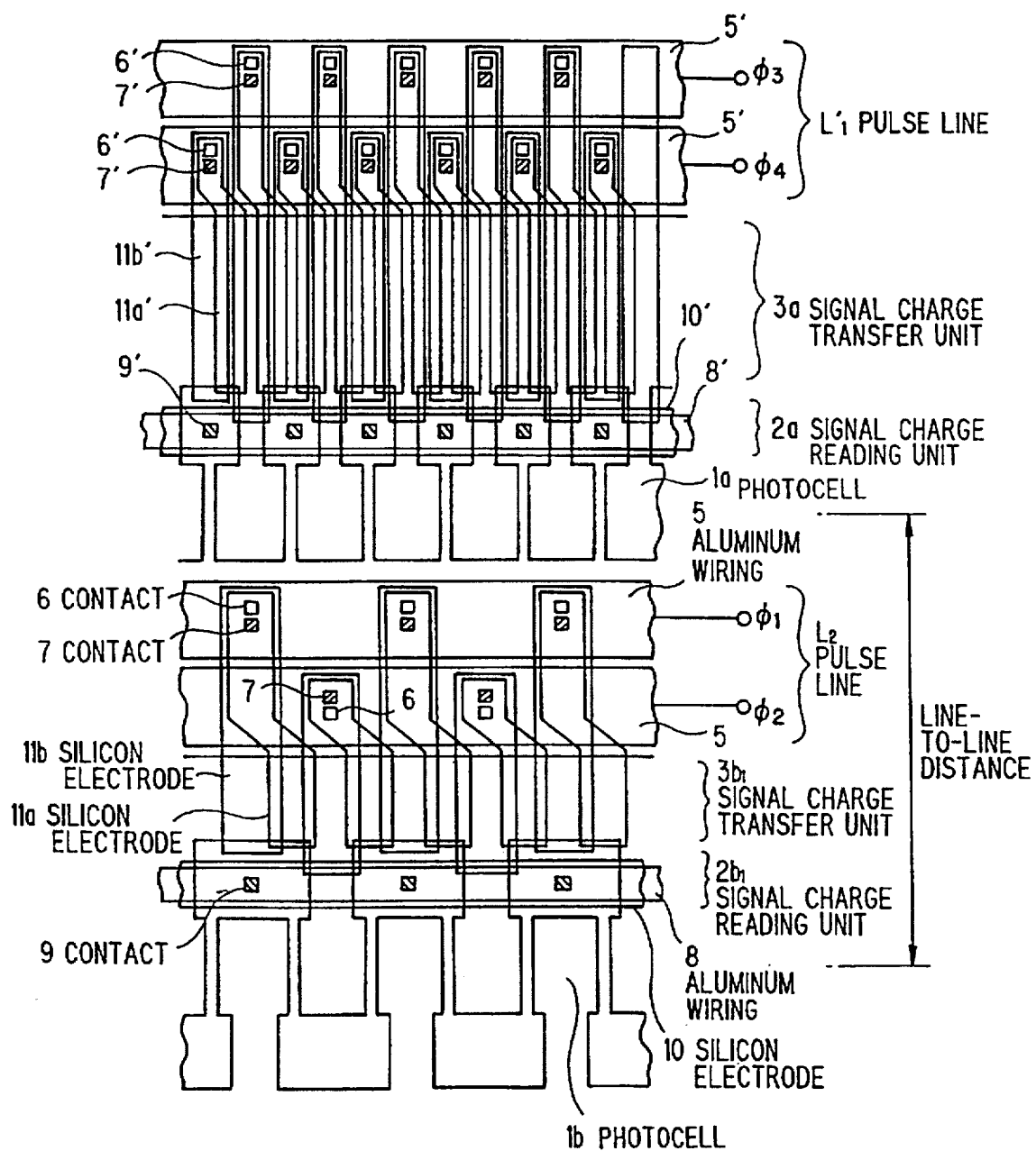
FIG. 6 is an enlarged view showing a region X2 surrounded by dotted line in FIG. 5.

FIG. 6 is an enlarged view of a region X2 surrounded by the dotted line in FIG. 5, wherein like parts are indicated by like reference numerals as used in FIG. 5.

With reference to FIG. 6, 5' is an aluminum wiring to which two-phase clock Φ3, Φ4 is impressed, 6' is a contact for connecting a polycrystalline silicon electrode 11a' of a CCD register forming the signal charge transfer unit 3a with the aluminum wiring 5', 7' is a contact for connecting two polycrystalline silicon electrodes 11a', 11b' of CCD register, 8' is an aluminum wiring to which a clock for driving signal charge reading unit 2a is impressed, and 9' is a contact for connecting a polycrystalline silicon electrode 10' forming a signal charge reading unit with the aluminum wiring 8'.

As seen from the comparison of the color linear image sensors in FIGS. 6 and 2, in this embodiment, the number of the signal charge reading units between adjacent photocells is decreased from two to one and the number of the signal charge transfer units between adjacent photocells is decreased from two to one, thereby reducing the line-to-line distance. Namely, as shown in FIG. 6, between the photocells 1a and 1b, only the signal charge reading unit 2b1 and signal charge transfer unit 3b1 are disposed, while two signal charge reading units 2a2, 2b1 and two signal charge transfer units 3a2, 3b1 are disposed between the photocells 1a and 1b in FIG. 2.

For example, in this embodiment, where the sizes of the signal charge reading unit and signal charge transfer unit are 12 μm, 30 μm, respectively incorporating the data of the conventional sensor in FIG. 1, the line-to-line distance is 126 μm(m=9), i.e., 42 μm(25%) reduced in comparison with that(line-to-line distance of 168 μm, m=12) of the conventional sensor in FIG. 1.

A color linear image sensor in the second preferred embodiment will be explained in FIG. 7, wherein like parts are indicated by like reference numerals as used in FIG. 5.

Figure 7:
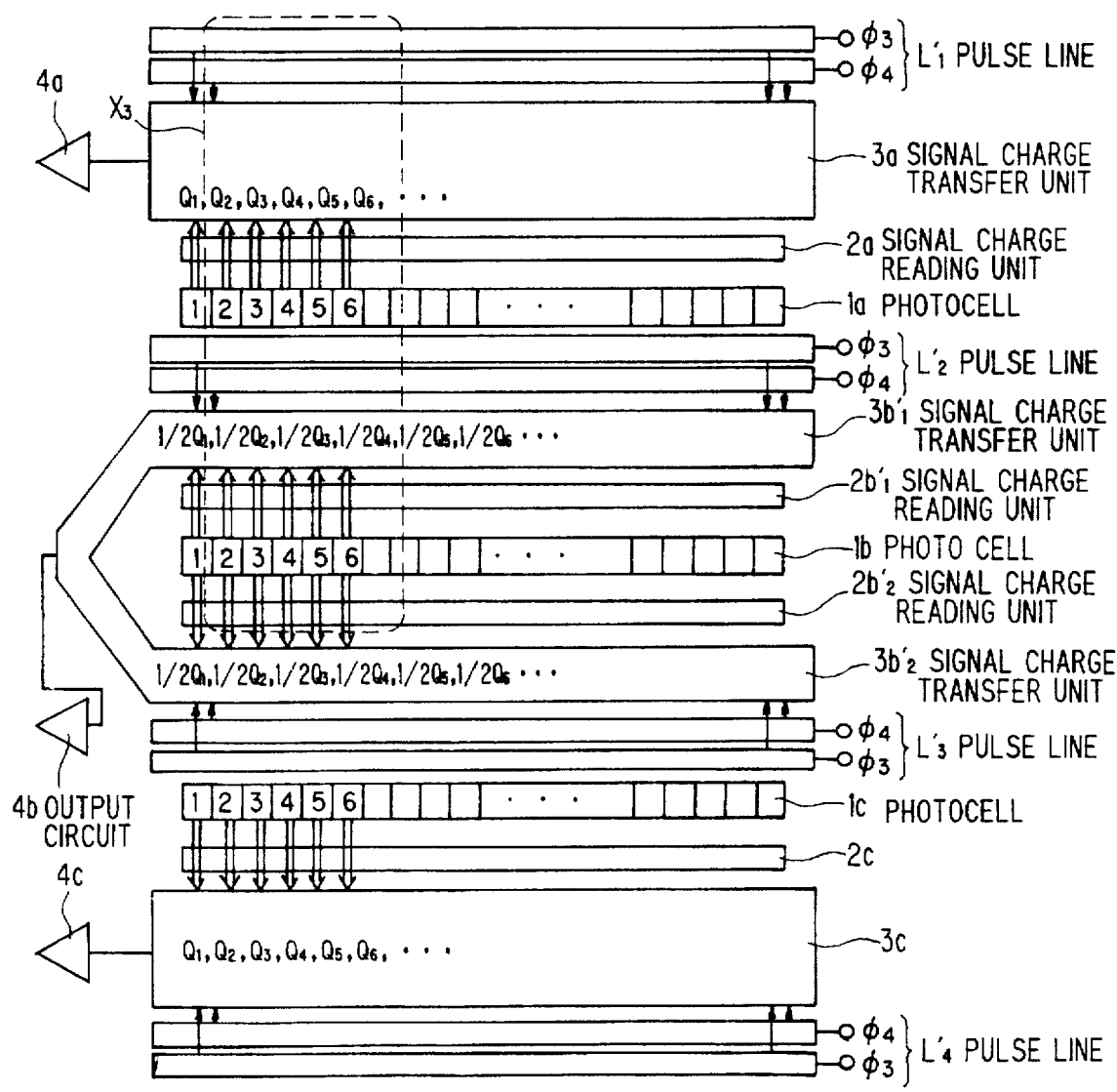
FIG. 7 is a plan view showing a color linear image sensor in a second preferred embodiment according to the invention.

In the second embodiment, as shown in FIG. 7, photocells 1a, 1c of three photocell lines 1a, 1b and 1c, signal charge reading units 2a, 2c and signal charge transfer units 3a, 3c, output circuits 4a, 4c, and pulse lines L1', L4' have the same size and composition as those of the first embodiment shown in FIG. 5.

In the second embodiment, signal charge in each of pixels of a central photocell 1b is read out through signal charge reading units 2b'1, 2b'2 simultaneously into signal charge transfer units 3b'1, 3b'2, respectively. Namely, about ½ of the signal charge in the first pixel to the final pixel(½Q1, ½Q2, ½Q3, . . . ) of the photocell 1b is read out into the signal charge transfer unit 3b'1. Similarly, the remainder of the signal charge in the first pixel to the final pixel of the same photocell 1b is read out into the signal charge transfer unit 3b'2.

Subsequently, the signal charges read into the signal charge transfer units 3b'1, 3b'2 are transferred by two-phase clocks Φ3, Φ4 supplied from pulse lines L2', L3' to a signal charge detection unit(not shown) which is formed as a floating diffusion region just before output circuit 4b or included in the output circuit 4b, where they are added and then are output therefrom.

In the second embodiment, since the number of the charge signals through the signal charge transfer units 3b'1, 3b'2 is equal to the number of signal charges(Q1, Q2, Q3, . . . ) through signal charge transfer units 3a, 3c, the two-phase clocks supplied from the pulse lines L2', L3' can be the same as the two-phase clocks Φ3, Φ4 supplied from pulse lines L1', L4'. Therefore, the number of input clocks thereof can be reduced less than that required in the first embodiment.

Figure 8:
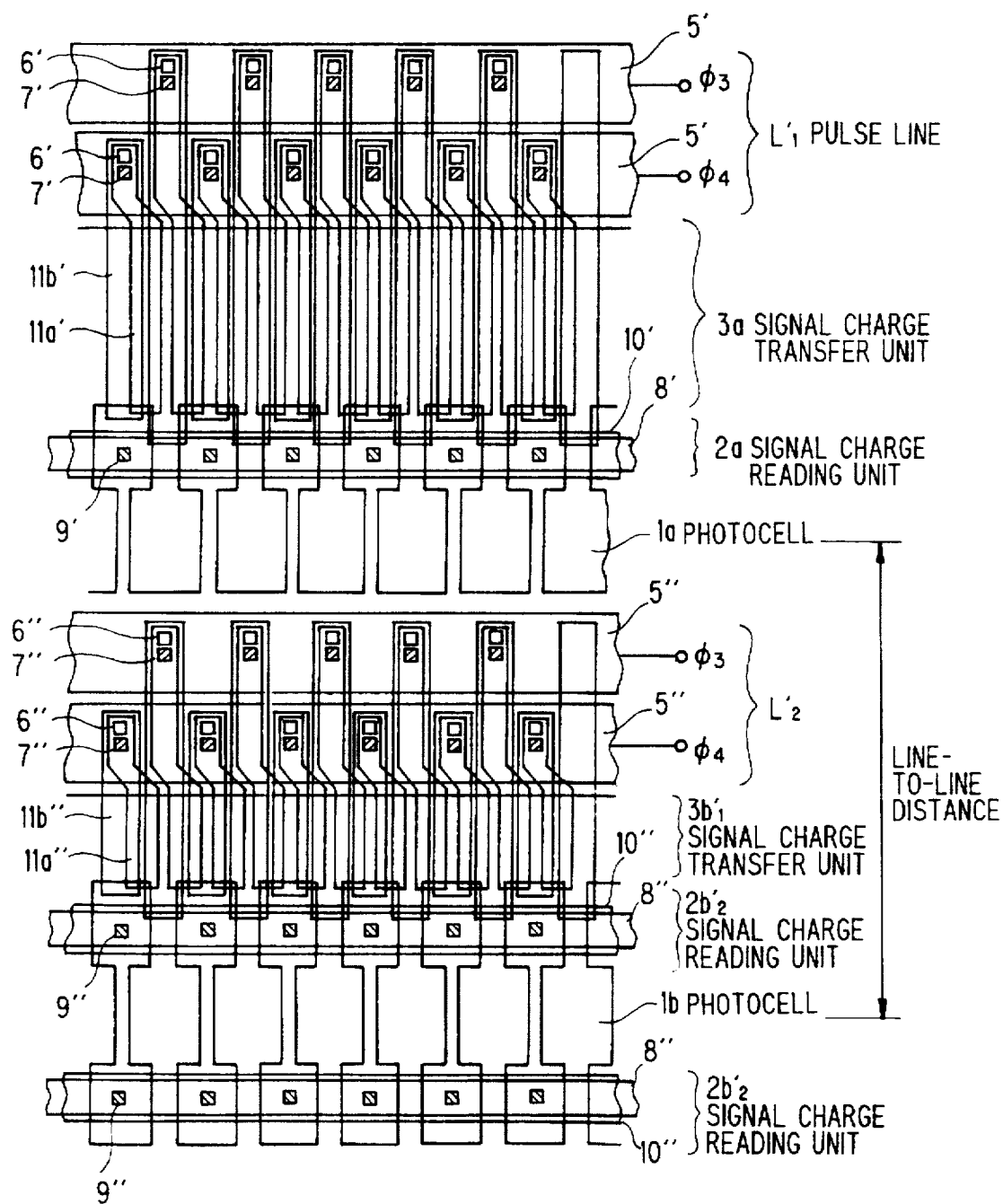
FIG. 8 is an enlarged view showing a region X3 surrounded by dotted line in FIG. 7.

FIG. 8 is an enlarged view of a region X3 surrounded by the dotted line in FIG. 7, wherein like parts are indicated by like reference numerals as used in FIG. 7.

With reference to FIG. 8, 5" is an aluminum wiring to which the two-phase clocks Φ3, Φ4 is impressed through the pulse line L2', 6" is a contact for connecting a polycrystalline silicon electrode 11a" of a CCD register forming the signal charge transfer unit 3b'1 with the aluminum wiring 5", 7" is a contact for connecting two polycrystalline silicon electrodes 11a", 11b" of the CCD register, 8" is an aluminum wiring to which clocks for driving signal charge reading units 2b'1, 2b'2 are impressed, and 9" is a contact for connecting a polycrystalline silicon electrode 10" forming a signal charge reading unit with the aluminum wiring 8".

As seen from FIG. 8, also in this embodiment, the number of the signal charge reading units and signal charge transfer units between adjacent photocells can be decreased by one, respectively, thereby reducing the line-to-line distance.

A color linear image sensor in the third preferred embodiment will be explained in FIG. 9, which is an enlarged view of a part corresponding to a region X3 surrounded by the dotted line in FIG. 7, wherein like parts are indicated by like reference numerals as used in FIG. 8.

Figure 9:
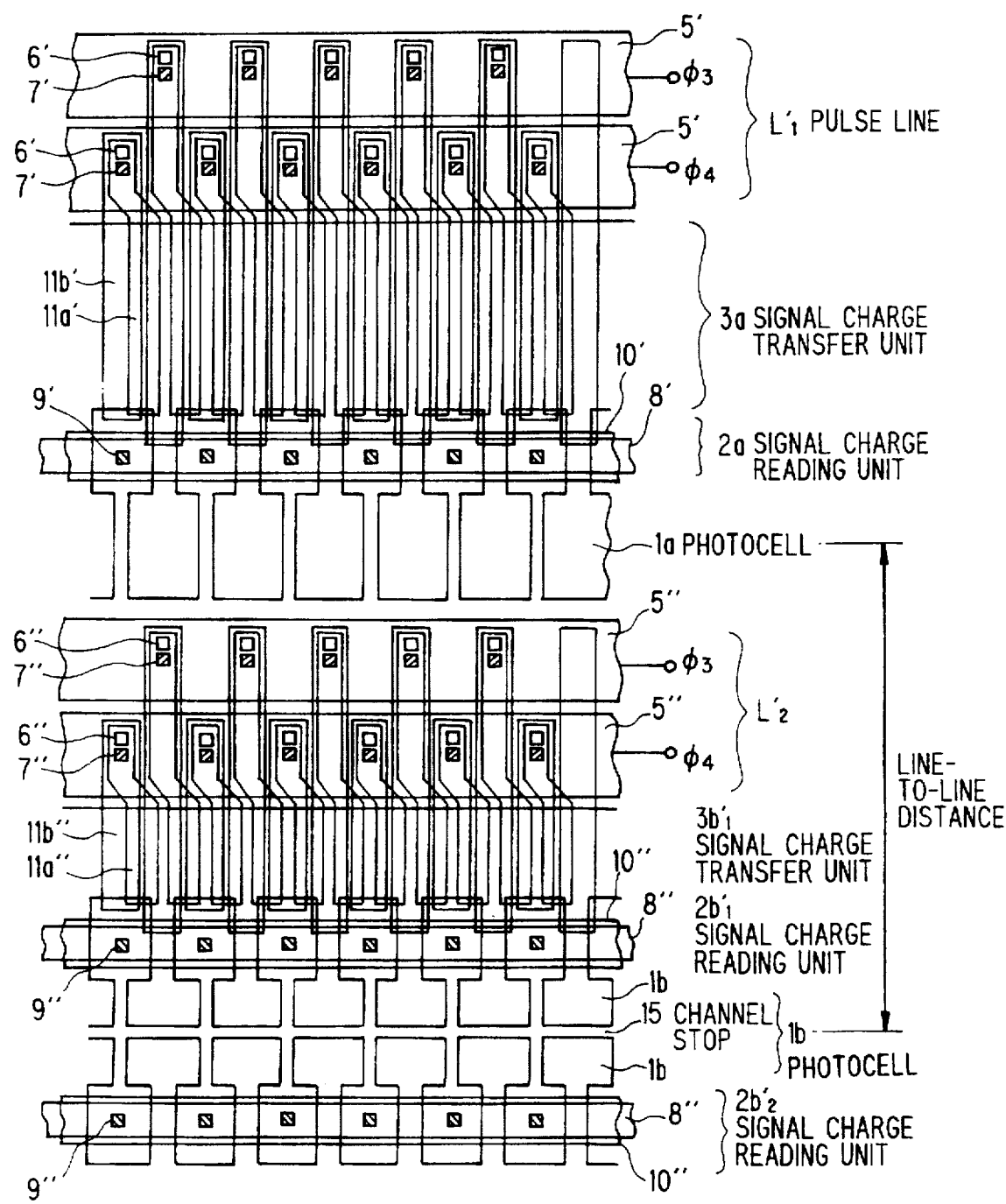
FIG. 9 is a plan view showing a part of a color linear image sensor in a third preferred embodiment according to the invention, the part of which corresponds to a region X3 surrounded by dotted line in FIG. 7.

In the third embodiment, as shown in FIG. 9, a channel stop 15 is provided at just the center of a photocell 1b to divide it into photocells 1b1 and 1b2. Namely, the third embodiment differs from the second embodiment in that the photocell 1b is separated.

In the second embodiment, due to a dispersion in production size(width) of the signal charge reading units 2b'1, 2b'2 or a shift in the clock timing impressed to the signal charge transfer units 2b'1, 2b'2, the signal charges(Q1, Q2, Q3, . . . ) read out from the photocell 1b into the signal charge transfer units 3b'1, 3b'2 may be not exactly divided into halves, respectively. Therefore, the size(width) of the signal charge transfer units 3b'1, 3b'2 needs to be a little greater than predetermined size.

With respect to this point, in the third embodiment, since the photocell 1b is accurately divided into halves by the channel stop 15, the signal charges(Q1, Q2, Q3, . . . ) read out from the photocell 1b into the signal charge transfer units 3b'1, 3b'2 can be divided into just halves, respectively.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A color image sensor, comprising:

a semiconductor substrate on which said color image sensor is formed;

three lines of photocells provided on said semiconductor substrate said three lines consisting of a central line and two exterior lines;

signal charge transfer units disposed adjacent and corresponding to said respective photocells; and signal charge reading units through which a signal charge in each of said photocells is read out into said signal charge transfer units adjacent to said each of said photocells;

wherein said signal charge transfer units which correspond to said exterior lines of photocells are located only outside the area between said exterior lines.

2. A color linear image sensor, according to claim 1, wherein:

one of said signal charge transfer units corresponding to said central photocell transfers an odd-numbered signal charge in said central photocell and the other of said signal charge transfer units corresponding to said central photocell transfers an even-numbered signal charge in said central photocell.

3. A color linear image sensor, according to claim 1, wherein:

said signal charge transfer units on both sides of said central photocell transfer a signal charge in each pixel of said central photocell which is read out divided into halves by said signal charge reading units provided on both sides of said central photocell.

4. A color linear image sensor, according to claim 3, wherein:

said central photocell is separated to divide a signal charge in each pixel of said central photocell into halves.

5. A color linear image sensor, comprising:

a semiconductor substrate on which said color linear image sensor is formed;

three lines of photocells provided on said semiconductor substrate;

signal charge transfer units disposed adjacent to said respective photocells; and signal charge reading units through which a signal charge in each of said photocells is read out into said signal charge transfer units adjacent to said each of said photocells;

wherein a central photocell of said three lines of photocells has two signal charge reading units and two signal charge transfer units, each of which being located one by one on both sides of said central photocell, and each of two photocells on both sides of said central photocell has one signal charge reading unit and one signal charge transfer unit, each of which being located outside each of said two photocells.

6. A color image sensor, comprising:

a semiconductor substrate on which said color image sensor is formed;

a plurality of photocells being provided in three lines on said semiconductor substrate, said three lines consisting of a central photocell line and two exterior photocell lines;

a plurality of signal charge transfer units, each of said plurality of signal charge transfer units being disposed adjacent and corresponding to one of said three photocell lines, said signal charge transfer units corresponding to the exterior photocell lines being located only outside the area between said exterior photocell lines, said signal charge transfer units corresponding to said central photocell line being located on both sides of said central photocell line and within the area between said two photocell exterior lines; and a plurality of signal charge reading units, each of said plurality of signal charge reading units being disposed and corresponding to an adjacent photocell line and an adjacent signal charge transfer unit of said plurality of signal charge transfer units, said each signal charge reading unit provided for reading a signal charge in said adjacent photocell line into said adjacent signal charge transfer unit.

7. A color image sensor, according to claim 6, wherein:

said central photocell line comprises a plurality of pixels, and one of said plurality of signal charge transfer units corresponding to the central photocell line transfers a signal charge in an odd-numbered pixel in said central photocell line and another of said signal charge transfer units corresponding to said central photocell line transfers a signal charge in an even-numbered pixel in said central photocell line.

8. A color image sensor, according to claim 6, wherein:

said central photocell line comprises a plurality of pixels, and each of said signal charge transfer units corresponding to said central photocell line transfers a signal charge in a corresponding pixel of the central photocell line, said signal being read in two parts by said signal charge reading units corresponding to each of said pixels of said central photocell line.

9. A color image sensor, according to claim 8, wherein:

said central photocell line is separated to divide a signal charge in each pixel of said central photocell line in two parts.

10. A color image sensor, according to claim 6, wherein said central photocell line has two corresponding signal charge reading units, one on either side of the central photocell line, and two signal charge transfer units, one on either side of the central photocell line, and each of the two exterior photocell lines has one corresponding signal charge reading unit and one corresponding signal charge transfer unit, said one corresponding signal charge reading unit and said one signal charge transfer unit being located outside the area enclosed by the two exterior photocell lines.

11. A color image sensor, according to claim 3, wherein:

said central photocell line is separated to divide a signal charge in each pixel of said central photocell line in two parts.

12. A color image sensor, according to claim 1, wherein said plurality of signal charge transfer units are formed as single-line CCD registers.

13. A color image sensor, according to claim 6, wherein said plurality of signal charge transfer units are formed as single-line CCD registers.

14. A color image sensor, comprising:

a semiconductor substrate on which said color linear image sensor is formed;

a plurality of photocells being provided in lines on said semiconductor substrate, said lines including an interior photocell line and an exterior photocell line;

a plurality of signal charge transfer units disposed adjacent and corresponding to each of said photocell lines, each of said signal charge transfer units corresponding to the exterior photocell line being located only outside the area between said exterior photocell line and the interior photocell line.

15. A color image sensor according to claim 1, wherein said center photocell line is divided into two photocells by a channel stop.

16. A color image sensor according to claim 5, wherein said center photocell is divided into two photocells by a channel stop.

17. A color image sensor according to claim 6, wherein said center photocell line is divided into two photocells by a channel stop.

18. A color image sensor according to claim 6, wherein the signal charges read into said signal charge transfer units corresponding to the exterior photocell lines and the signal charges read into said signal charge transfer units corresponding to the central photocell lines are transferred in accordance with a common clock.

19. A color image sensor, comprising:

a semiconductor substrate on which said color linear image sensor is formed;

a plurality of photocells being provided in lines on said semiconductor substrate, said lines including an interior photocell line and two exterior photocell lines;

a plurality of signal charge transfer units disposed adjacent and corresponding to each of said photocell lines, each of said signal charge transfer units corresponding to the exterior photocell lines being located only outside the area between said two exterior photocell lines.

* * * * *